(12) United States Patent
Fujiwara et al.

(10) Patent No.: US 6,587,262 B1
(45) Date of Patent: Jul. 1, 2003

(54) UV SYNTHETIC SILICA GLASS OPTICAL MEMBER AND REDUCTION PROJECTION EXPOSURE APPARATUS USING THE SAME

(75) Inventors: Seishi Fujiwara, Sagamihara (JP); Norio Komine, Sagamihara (JP); Hiroki Jinbo, Yokohama (JP)

(73) Assignee: Nikon Corporation, Tokyo (JP)

( * ) Notice: Subject to any disclaimer, the term of this patent is extended or adjusted under 35 U.S.C. 154(b) by 13 days.

(21) Appl. No.: 09/686,907

(22) Filed: Oct. 12, 2000

Related U.S. Application Data

(63) Continuation-in-part of application No. PCT/JP00/00873, filed on Feb. 16, 2000.

(30) Foreign Application Priority Data

Feb. 16, 1999 (JP) ............................................ 11-037670

(51) Int. Cl.⁷ .............................................. G02B 13/14
(52) U.S. Cl. ...................... 359/350; 359/355; 359/642; 359/900; 65/900; 252/588; 501/53; 501/94; 501/900
(58) Field of Search ................................. 359/350, 355, 359/642, 900; 65/900; 252/588; 501/53, 94, 900, 905

(56) References Cited

FOREIGN PATENT DOCUMENTS

| EP | 720970 | 7/1996 |
|----|--------|--------|
| EP | 835848 | 4/1998 |
| EP | 0 720 970 B1 * | 9/1998 |
| JP | 06-305736 | 11/1994 |
| JP | 09-235134 | 9/1997 |
| JP | 10-324528 | 12/1998 |
| JP | 10-330120 | 12/1998 |
| JP | 2000-239031 | 9/2000 |
| JP | 2000-239040 | 9/2000 |

* cited by examiner

Primary Examiner—Audrey Chang
Assistant Examiner—Craig Curtis
(74) Attorney, Agent, or Firm—Oliff & Berridge PLC

(57) ABSTRACT

This invention provides a synthetic silica glass optical member used together with light having a specific wavelength of 250 nm or less, in which the difference between the maximum value and the minimum value of transmittance [%/cm] per cm in thickness for the light in a predetermined direction within a plane perpendicular to the optical axis is 2.0%/cm or less.

12 Claims, 7 Drawing Sheets

UV SYNTHETIC SILICA GLASS OPTICAL MEMBER AND REDUCTION PROJECTION EXPOSURE APPARATUS USING THE SAME

RELATED APPLICATION

The present application is a continuation-in-part application No. PCT/JP00/0873 filed on Feb. 16, 2000, designating U.S.A and now pending.

BACKGROUND OF THE INVENTION

1. Field of the Invention

The present invention relates to a UV synthetic silica glass optical member and a reduction projection exposure apparatus using the same and, more particularly, to a synthetic silica glass optical member suitably used for a lens of an imaging optical system, the substrate of a photomask such as a reticle used to print the circuit pattern of an integrated circuit, a diffraction optical element (DOE), and an etalon plate for a light source in a reduction projection exposure apparatus using UV light such as an excimer laser beam, and a reduction projection exposure apparatus using the synthetic silica glass optical member.

2. Background Art

Conventionally, to transfer the pattern of an integrated circuit such as an IC or LSI, a reduction projection exposure apparatus (or photolithography apparatus) is mainly used. Along with the recent increase in integration density of integrated circuits, a wider exposure region and a high resolution over the entire exposure region are required for the projection optical system of an apparatus. To increase the resolution of the projection optical system, improvements of the apparatus have been examined, including shortening the exposure wavelength and increasing the numerical aperture (NA) of the projection optical system.

In the technique of making the exposure wavelength shorter, the light source used for an apparatus changes from g-line (wavelength: 436 nm) to i-line (wavelength: 365 nm), KrF excinier laser (wavelength: 248 nm), or ArF excimer laser (wavelength: 193 nm). To further increase the integration density of integrated circuits, use of a light source such as an $F_2$ laser (wavelength: 157 nm), X-rays, or electron beam has been examined. Of these light sources, a reduction projection exposure apparatus using the $F_2$ laser can be manufactured on the basis of the conventional design concept and therefore has recently received a great deal of attention.

On the other hand, an optical member used for the optical system of the apparatus is required to have sufficient optical characteristics for use together with light having such a short wavelength. Generally, a reduction projection exposure apparatus using light having a longer wavelength than i-line uses multi-component optical glass as the lens member of its illumination optical system or projection optical system. However, such optical glass abruptly decreases its internal transmittance for light having a shorter wavelength than i-line and, especially, rarely exhibits transmittance for light having a wavelength of 250 nm or less. For this reason, as materials of a lens of the optical system in a reduction projection exposure apparatus using an excimer laser as a light source, synthetic silica glass and single-crystal calcium fluoride ($CaF_2$) are used. These two materials are necessary for chromatic aberration correction in the imaging optical system of an excimer laser.

Of the above optical materials, synthetic silica glass has a high light transmittance and, additionally, excellent characteristics: satisfactory excimer laser resistance, resistance to a change in temperature, satisfactory corrosion resistance and elastic performance, and small linear expansion coefficient (about $5.5 \times 10^{-7}$/K) near room temperature. Hence, for a reduction projection exposure apparatus, synthetic silica glass has been examined as a material of an optical member for which optical characteristics are required, including satisfactory UV resistance, and low possibility of heat generation in the substrate and thermal expansion due to the heat. A detailed example of such an optical member is the substrate of a photomask such as a reticle that is one of important elements in printing a pattern on a wafer.

Conventionally, silica glass is synthesized by a soot method such as VAD, OVD, or sol-gel method, or a direct method. To synthesize silica glass, a silicon compound such as silicon tetrachloride, silicon tetrafluoride, or organic silicon compound is used as a material. When a component such as germanium (Ge), titanium (Ti), boron (B), fluorine (F), or aluminum (Al) is doped as needed, the physical properties of silica glass can be changed. In Japanese Patent Application Laid-open No. HEI 6-305736, a method of manufacturing synthetic silica glass as a material of a lens used together with an excimer laser beam is disclosed. However, generally, an optical system such as a projection optical system or illumination optical system is constructed by not a single lens but a plurality of lenses (lens group), so the light transmittance of the entire optical system corresponds to the integrated value of light transmittances of the lenses. For this reason, even a lens formed from synthetic silica glass manufactured by the above method still has insufficient light transmittance in use together with light having a specific wavelength of 250 nm or less.

When synthetic silica glass is used as a material of a photomask substrate, problems have been pointed out, including an increase in transmittance loss due to internal absorption or internal scattering of light, color center induced by the laser, degradation in optical performance due to heat or fluorescent light, and compaction that changes the density. Especially, the tendency becomes conspicuous when synthetic silica glass is used together with light having a wavelength of 190 nm or less.

Thus, an optical member such as a lens or photomask substrate formed from synthetic silica glass has insufficient optical characteristics such as UV resistance or light transmittance for light having a specific wavelength of 250 nm or less. When these optical members are used in a reduction projection exposure apparatus using a light source such as an ArF excimer laser (wavelength: 193 nm) or $F_2$ laser (wavelength: 157.6 nm), line-width unevenness (print unevenness) in the pattern transfer process, and the like pose problems and make it very hard to achieve high resolution. For this reason, as a material of an optical member used together with light having a specific wavelength of 190 nm or less, single-crystal calcium fluoride has been examined because of its higher light transmittance and satisfactory UV resistance.

However, since single-crystal calcium fluoride has low resistance to a change in temperature, and is fragile and therefore readily breaks, damage easily occurs in the pattern formation process. In addition, since the linear expansion coefficient is as large as about 40 times that of silica glass, it is difficult to form a highly accurate mask pattern, and very strict temperature management is required for exposure processing.

SUMMARY OF THE INVENTION

The shorter the wavelength of light used in a reduction projection exposure apparatus becomes, the higher the optical performance required for an optical member such as a lens member or photomask member becomes. However, an optical member having desired optical performance, i.e., suitable for use in an apparatus using light having a wavelength of 250 nm or less and, more particularly, light having a wavelength of 190 nm or less has not been developed yet.

It is an object of the present invention to provide a UV synthetic silica glass optical member which has high light transmittance and UV resistance, achieves high resolution without generating any line-width unevenness (print unevenness) in the pattern transfer process, and therefore is suitable for use in a reduction projection exposure apparatus using light having a wavelength of 250 nm or less.

The present inventors have extensively studied to achieve the above object, consequently found that when in a silica glass optical member, the difference between the maximum value and the minimum value of transmittance [%/cm] per cm in thickness for the light in a predetermined direction within the plane perpendicular to the optical axis is 2.0%/cm or less, the above problems are solved, and completed the present invention.

More specifically, according to the present invention, there is provided a synthetic silica glass optical member used together with light having a specific wavelength of not more than 250 nm, wherein a difference between a maximum value and a minimum value of transmittance [%/cm] per cm in thickness for the light in a predetermined direction within a plane perpendicular to an optical axis is not more than 2.0%/cm.

According to the present invention, there is also provided a reduction projection exposure apparatus comprising an exposure light source for emitting light having a wavelength of not more than 250 nm, a photomask formed with an original image of pattern, an illumination optical system for irradiating the photomask with the light emitted from the light source, a projection optical system for projecting the pattern image output from the photomask onto a photosensitive substrate, and an alignment system for aligning the photomask and the photosensitive substrate, wherein at least a part of lenses of the illumination optical system and projection optical system, and the photomask are formed from synthetic silica glass in which a difference between a maximum value and a minimum value of transmittance [%/cm] per cm in thickness for the light in a predetermined direction within a plane perpendicular to an optical axis is not more than 2.0%/cm.

As described above, in the optical member of the present invention, when the difference between the maximum value and the minimum value of transmittance [%/cm] per cm in thickness for the light in the predetermined direction within the plane perpendicular to the optical axis is set to 2.0%/cm or less, and the member is used as a lens of the optical systems of the reduction projection exposure apparatus, or photomask substrate, the decrease in light transmittance of the entire optical system is suppressed. In the photomask, high light transmittance can be obtained, and local thermal expansion of the member can be suppressed. Hence, high resolution can be attained without generating line-width unevenness (print unevenness) in the pattern transfer process.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DETAILED DESCRIPTION OF THE PREFERRED EMBODIMENTS

Figure 1:
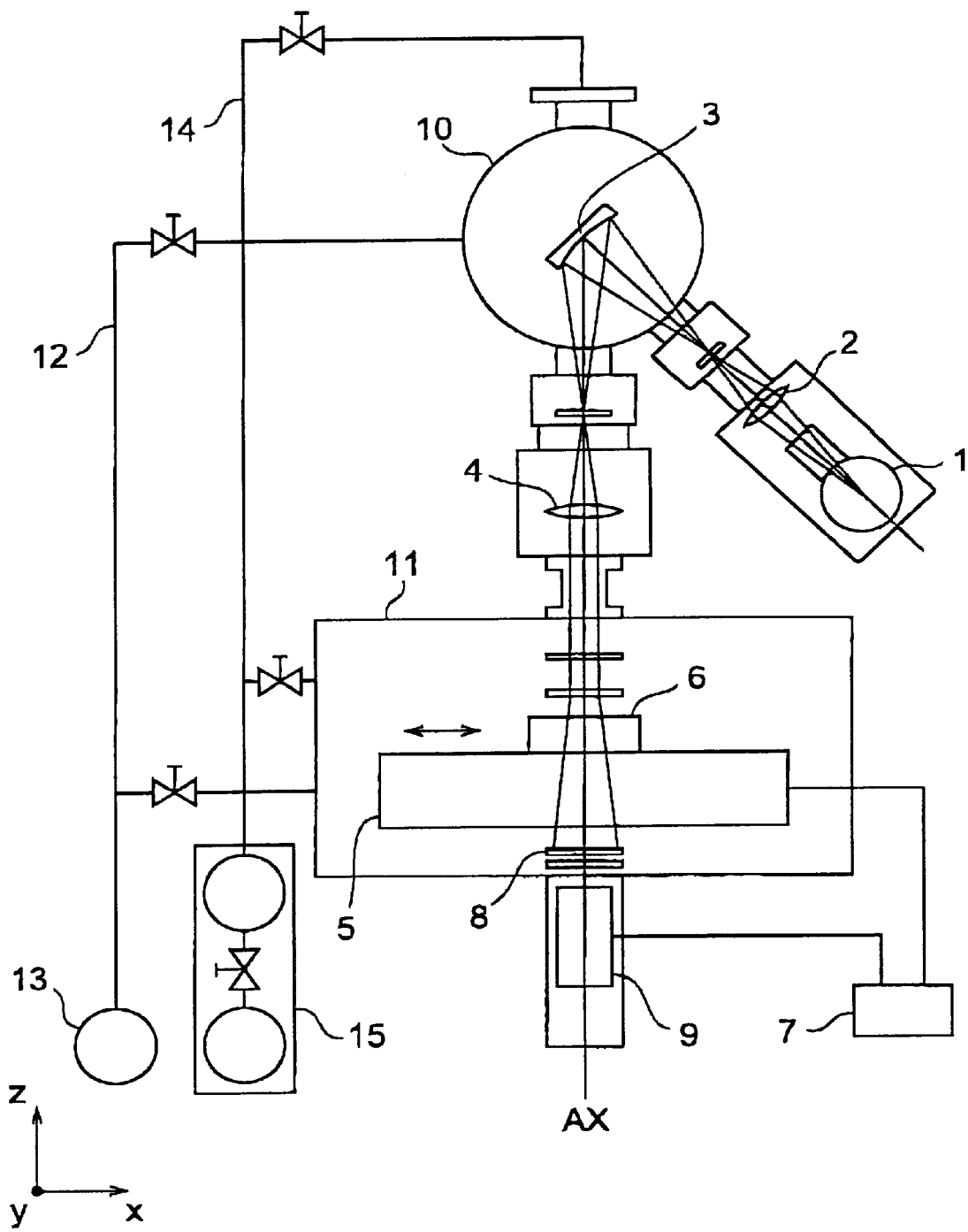
FIG. 1 is a schematic view showing an example of a vacuum UV spectrophotometer for measuring the transmittance of an optical member.

A preferred embodiment of the present invention will be described below in detail with reference to the accompanying drawings as needed. The same reference numerals denote the same and corresponding parts throughout the drawings.

An optical member of the present invention is a synthetic silica glass optical member used together with light having a specific wavelength of 250 nm or less, for which the difference between the maximum value and the minimum value of transmittance [%/cm] for the light per cm in thickness in a predetermined direction within a plane perpendicular to the optical axis is 2.0%/cm or less. The difference between the maximum value and the minimum value of transmittance per cm in thickness is an index of variation in light transmittance due to nonuniformity of the member. As the difference between the maximum value and the minimum value of transmittance becomes small, the light transmittance becomes uniform over the member. According to the present invention, when the difference between the maximum value and the minimum value of transmittance per cm in thickness of the optical member is set to 2.0%/cm or less, and the member is used as a lens of the optical system of a reduction projection exposure apparatus, degradation in light transmittance of the entire optical system is suppressed. When the member is used as a photomask substrate, high light transmittance can be obtained, and distortion due to local thermal expansion of the member can be suppressed. Hence, high resolution can be attained without generating line-width unevenness (print unevenness) in the pattern transfer process. The difference between the maximum value and the minimum value of transmittance is preferably obtained for a region having a size of 1.5 cm or more in a predetermined direction of the member. In use together with light having a specific wavelength of 190 nm or less, e.g., $F_2$ laser beam (157.6 nm), the difference between the maximum value and the minimum value of transmittance per ¼ inch in thickness (%/(¼ inch)] is preferably 2.0%/(¼ inch) or less. When an optical member whose difference between the maximum value and the minimum value of transmittance per is 2.0%/(¼ inch) or less is used, higher resolution corresponding to a line width of 0.1 µm or less can be attained in the pattern transfer process, and line-width unevenness tends to be suppressed.

A method of measuring the transmittance of the optical member according to the present invention will be described next. The transmittance of the optical member of the present invention is preferably measured using a vacuum UV spectrophotometer shown in FIG. 1. Referring to FIG. 1, the Z-axis is set parallel to an optical axis AX, the X-axis is set parallel to the page surface within a plane perpendicular to the optical axis AX, and the Y-axis is set perpendicular to the page surface. Light emitted from a light source 1 reaches a holographic grating 3 through a lens 2. The light diffracted by the holographic grating 3 becomes incident, through a lens 4, on a sample 6 which is held on a scanning stage 5 in parallel to the X-Y plane, i.e., perpendicular to the optical axis. The scanning stage 5 is electrically connected to an information processing apparatus 7. A control signal is sent from the information processing apparatus 7 to the scanning stage 5 to control the position of the sample 5, while data related to position coordinates are sent from the scanning stage 5 to the information processing apparatus 7. The light transmitted through the sample 6 reaches a photo-multiplier 9 as a detector through a scintillator 8. The information processing apparatus 7 is electrically connected to the photo-multiplier 9. A control signal is sent from the, information processing apparatus 7 to the photo-multiplier 9, while a measurement data signal is sent from the photo-multiplier 9 to the information processing apparatus 7. The information processing apparatus 7 obtains the transmittance of the sample for predetermined light on the basis of the measurement values of the intensity of light incident on the sample and that of light transmitted through the sample. Vacuum chambers 10 and 11 accommodating the holographic grating 3 and the scanning stage 5 holding the sample 6 are connected to a vacuum pump 13 through an exhaust line 12 and to a turbo molecular pump 15 through an exhaust line 14, respectively. After the sample 6 is set in the vacuum chamber 11 (preparation for measurement), the pressure in the optical path from the light source 1 to the photo-multiplier 9 through the holographic grating 3 is reduced by the vacuum pump 13. The optical path is kept vacuum (about $10^{-2}$ Pa) by the turbo molecular pump 15 in measuring the transmittance.

Figure 2:
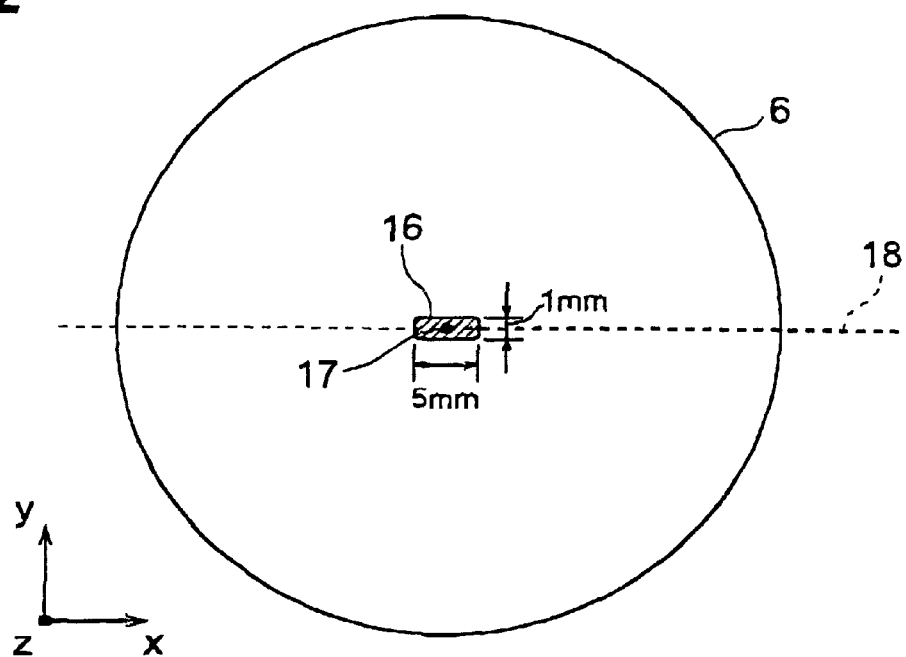
FIG. 2 is a schematic view showing the shape of light with which a sample is irradiated and the scanning direction of the light in measurement using the spectrophotometer shown in FIG. 1.
Figure 3:
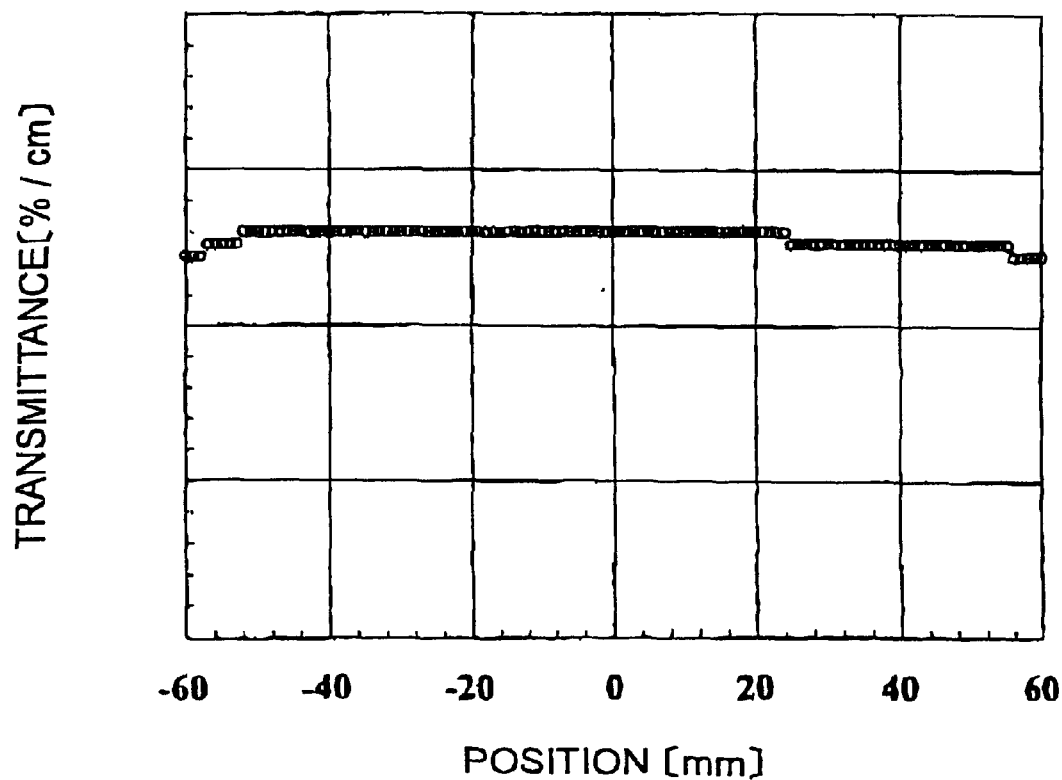
FIG. 3 is a graph showing an example of correlation between the sample position and the transmittance, which is obtained by transmittance measurement using the spectrophotometer shown in FIG. 1.

Since the scanning stage 5 holding the sample 6 can two-dimensionally move along the X-Y plane, the difference between the maximum value and the minimum value of transmittance per cm in thickness [%/cm] in a predetermined direction within the plane perpendicular to the optical axis AX can be obtained. The difference between the maximum value and the minimum value of transmittance is preferably measured for a region having a size of 1.5 cm or more in the predetermined direction. If the measurement region has a size smaller than the lower limit value, accurate measurement of the variation in transmittance of the member tends to be impossible. For example, to measure the transmittance of the circular sample 6 having a diameter of 120 mm, as shown in FIG. 2, a light beam 16 having a size of 1 mm×5 mm is used to scan the sample 6 along a line 18 parallel to the X-axis from one edge to the other edge through a center 17, thereby obtaining a graph shown in FIG. 3, which represents the correlation between the transmittance and the member position in the scanning region. On the basis of the measurement result, the difference between the maximum value and the minimum value of transmittance of the sample is obtained. Note that the abscissa of the graph shown in FIG. 3 represents the position from the center 17 of the sample.

As described above, the optical member of the present invention has excellent optical characteristics, i.e., high light transmittance over the member, which cannot be achieved by the conventional optical member. When the optical member is used together with light having a wavelength of 190 nm to 250 nm, the hydroxyl group concentration in the member is preferably high. More specifically, the hydroxyl group concentration is preferably 500 ppm to 1,200 ppm. If the hydroxyl group concentration in the member is lower than 500 ppm, the light transmittance tends to be low for light having a wavelength of 190 nm to 250 nm. If the hydroxyl group concentration exceeds 1,200 ppm, compaction tends to occur. In addition, the distribution of hydroxyl group concentration represented by (distribution of hydroxyl group concentration [%]={($C_{max}-C_{min}$)/$C_{max}$}×100

(where $C_{max}$ and $C_{min}$ are the maximum value and minimum value of hydroxyl group concentration in a predetermined direction of the member, respectively) is preferably 20% or less. When the distribution of hydroxyl group concentration exceeds 20%, the variation in transmittance for the light tends to be large.

The optical member having high light transmittance over the member for light having a wavelength of 190 nm to 250 nm is obtained for the first time by using silica glass manufactured by method to be described below.

More specifically, as the first method of manufacturing silica glass according to the present invention, in a method (a) called the direct method, i.e., a method (a) of hydrolyzing a silicon compound in oxyhydrogen flame and depositing obtained fine glass particles on a target and simultaneously vitrifying the glass particles to obtain a silica glass ingot, the type of gas (raw material, oxygen, or hydrogen) injected from each tube and the injection conditions (flow rate and flow speed) are appropriately adjusted using a burner having a multi-tubular structure, and also, the target is made to oscillate with a oscillation width of 10% to 35% of the ingot diameter and the oscillation speed of 100 mm/sec or less. If the oscillation width is smaller than 10%, the variation in hydroxyl group concentration of silica glass tends to be large. If the oscillation width exceeds 35%, ingot formation tends to be difficult. When the oscillation speed exceeds 100 mm/sec, ingot formation tends to be difficult. When the direction of oscillating of the target is reversed, the oscillation speed is 0 mm/sec.

Figure 4:
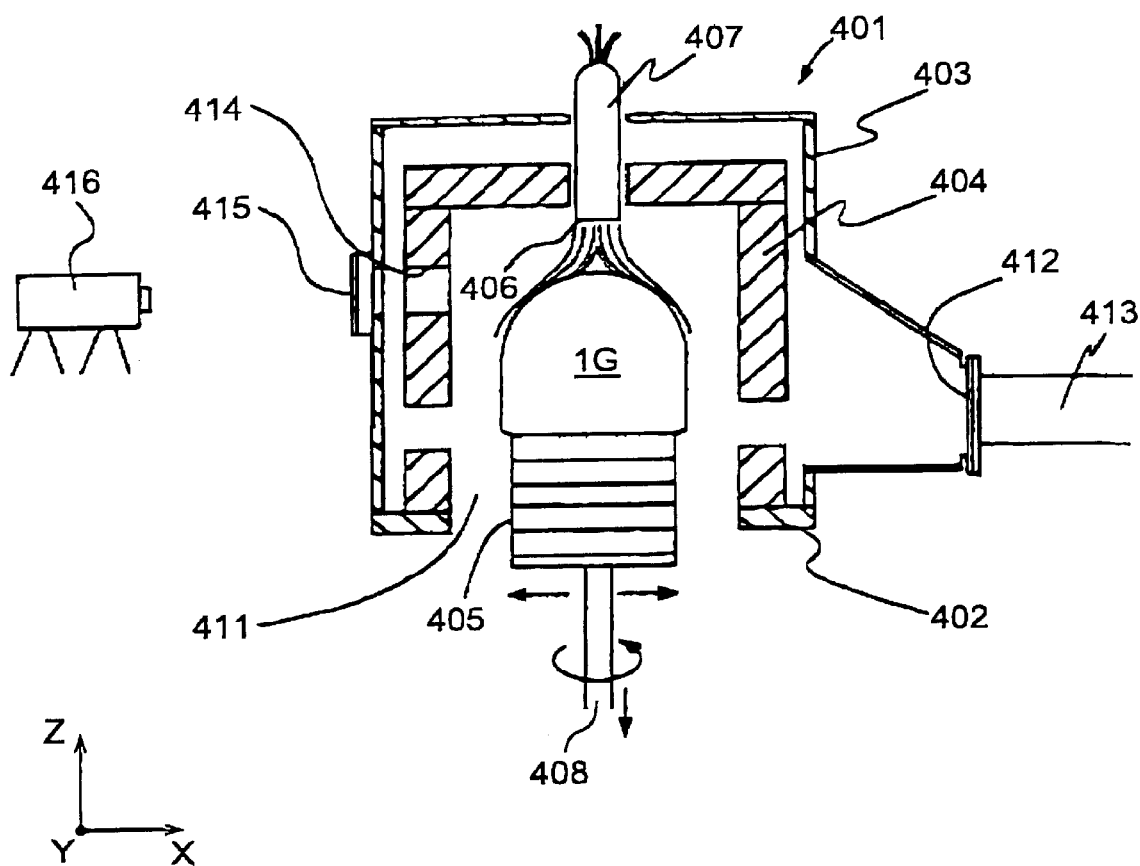
FIG. 4 is a schematic view showing an example of an apparatus for manufacturing synthetic silica glass according to the present invention.

FIG. 4 is a view schematically showing an apparatus used for the first manufacturing method. In a silica glass manufacturing apparatus 401, a silica glass burner 407 has a multi-tubular structure and is arranged at the upper portion of the furnace while having its distal end portion 406 directed toward a target 405. The furnace wall is formed from a furnace frame 403 and refractory 404 and has an observation window (not shown), an IR camera monitor window 415, and an exhaust vent 412 connected to an exhaust duct 413. The target 405 for IG formation is placed at the lower portion of the furnace. The target 405 is connected to an X-Y stage (not shown) outside the furnace through a support shaft 408. The support shaft 408 can be rotated by a motor. The X-Y stage can be two-dimensionally moved in the X- and Y-axis directions by an X-axis servo motor and Y-axis servo motor.

A silicon compound and carrier gas are injected from a tube arranged at the center of the burner 407, and oxygen gas and hydrogen gas are injected from tubes arranged around the tube arranged at the center at predetermined flow rates and flow speeds. Fine silica glass particles are generated by reaction of the silicon compound in the oxyhydrogen flame. The fine silica glass particles are deposited on the target 405 oscillating under conditions that the oscillation width is 10% to 35% of the ingot diameter and the swing speed is 100 mm/sec or less, and simultaneously melted and vitrified to obtain an ingot IG of transparent silica glass. At this time, the upper portion of the ingot IG is covered with the flame, and the target is pulled down in the Z direction such that the position of the synthetic surface at the upper portion of the ingot is always kept equidistant from the burner.

Figure 5:
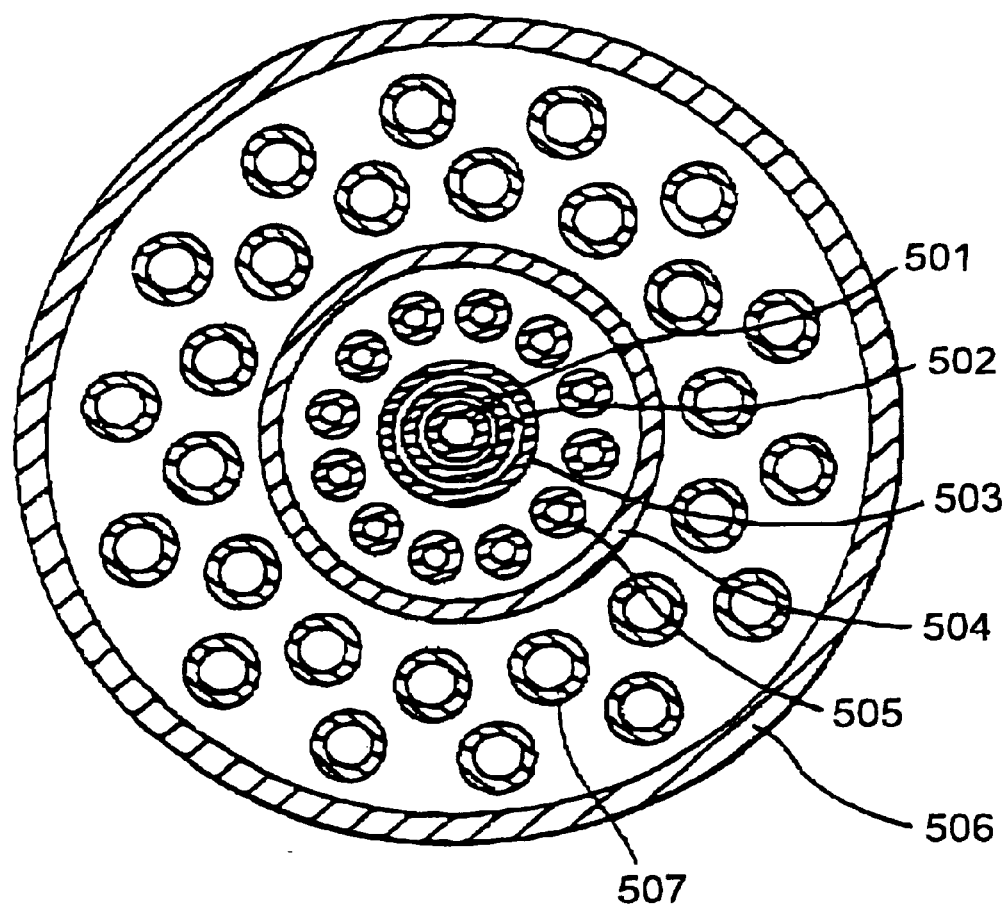
FIG. 5 is a schematic view showing an example of a burner used to manufacture synthetic silica glass according to the present invention.

FIG. 5 is a view schematically showing the burner having a multi-tubular structure in FIG. 4. The burner shown in FIG. 5 comprises a first tube 501 arranged at the central portion, a second tube 502 concentrically arranged around the first tube, a third tube 503 concentrically arranged around the second tube, a fourth tube 504 concentrically arranged around the third tube, a plurality of fifth tubes 505 arranged between the outer surface of the fourth tube and the inner surface of the fourth tube, a sixth tube 506 concentrically arranged around the fourth tube, and a plurality of seventh tubes 507 arranged between the outer surface of the fourth tube and the inner surface of the sixth tube. When silicon halide is used as a material, silicon halide diluted by a carrier gas such as nitrogen, helium, oxygen, or hydrogen is injected from the first tube 501. When the silicon halide is a liquid at room temperature, it is heated and gasified, or when the silicon halide is a gas at room temperature, it is directly supplied to the first tube 501 together with the carrier gas while controlling its flow rate using a mass flow controller. When the material is an organic silicon compound, it is gasified by a vaporizer while controlling its flow rate by a mass flow controller, and then supplied to the first tube 501 together with a carrier gas such as nitrogen or helium. In accordance with the type of silicon compound, oxygen gas or hydrogen gas is injected from a predetermined tube of the second tube 502 to seventh tubes 507 under predetermined conditions (flow rate and flow speed). More specifically, when silicon halide is used as a material, oxygen, hydrogen, hydrogen, oxygen, hydrogen, and oxygen are injected from the tubes sequentially from the inner side, i.e., the second tube 502, thereby preferably obtaining silica glass according to the present invention. When an organic silicon compound is used as a material, hydrogen, oxygen, hydrogen, oxygen, hydrogen, and oxygen are injected from the tubes sequentially from the inner side, i.e., the second tube 502, thereby preferably obtaining silica glass according to the present invention. Referring to FIG. 5, the burner having five tubes concentrically arranged and a plurality of small tubes arranged there between has been described. Even when a burner having seven tubes concentrically arranged and a plurality of small tubes arranged there between is used, silica glass according to the present invention can be preferably obtained.

In the first manufacturing method, the obtained silica glass is preferably not subjected to a secondary process, i.e., a process of deforming the silica glass at a high temperature of 1,500° C. or more. When the secondary process is performed, the variation in transmittance of the obtained silica glass tends to be large.

When the optical member of the present invention is to be used together with light having a wavelength of 190 nm or less, the hydroxyl group concentration in the member is preferably 20 ppm or less. In addition, the distribution of hydroxyl group concentration represented by $$\text{(distribution of hydroxyl group concentration [\%])} = \{(C_{max} - C_{min})/C_{max}\} \times 100$$

(where $C_{max}$ and $C_{min}$ are the maximum value and minimum value of hydroxyl group concentration in a predetermined direction of the member, respectively) is preferably 20% or less. When the distribution of hydroxyl group concentration exceeds 20%, the variation in transmittance for the light tends to be large. When the hydroxyl group concentration exceeds 20 ppm, sufficient light transmittance for light having a wavelength of 190 nm or less tends not to be obtained because of the influence of absorption band due to the hydroxyl group. When the distribution of hydroxyl group concentration exceeds 20%, the difference between the maximum value and the minimum value of transmittance of the member tends to be large.

The optical member having high light transmittance over the member for light having a wavelength of 190 nm or less is obtained for the first time by using silica glass manufactured by a method to be described below as a material.

More specifically, as the second method of manufacturing silica glass according to the present invention, in a method (b) called VAD of soot methods, i.e., a method (b) of hydrolyzing a silicon compound in oxyhydrogen flame to obtain fine glass particles (soot) depositing fine glass particles on a target to form porous glass (soot body), dehydrating the resultant porous glass, and consolidating the glass at a temperature corresponding to the softening point (preferably, melting point) or more to obtain a silica glass ingot, the type of gas (raw material, oxygen, or hydrogen) injected from each tube and the injection conditions (flow rate and flow speed) are appropriately adjusted using a burner having a multi-tubular structure to synthesize fine silica glass particles, and also, silica glass obtained from the fine silica glass particles is dehydrated and then processed in a fluorine atmosphere (fluorine doping process). In the second manufacturing method, by so-called isotactic pressing of uniformly pressing silica glass, the silica glass is pressed and molded while keeping uniform distribution of concentration of contained fluorine Silica glass having low hydroxyl group concentration can also be obtained even by the conventional VAD. However, silica glass obtained by this method has oxygen-deficient defects (Vo) ($\equiv$Si—Si$\equiv$, $\equiv$ means not triple bond but bond to three oxygen atoms), and an absorption band near 160 nm tends to form due to the defects. The present inventors estimate that the reason why the silica glass obtained by the second manufacturing method has high light transmittance for light having a wavelength of 190 nm or less is that the oxygen-deficient defects (≡Si—Si≡) formed in the silica glass has a structure represented by ≡Si—F when fluorine is doped, and formation of the absorption band near 160 nm due to the defects is suppressed.

The fluorine content in the silica glass obtained by the second manufacturing method is preferably 0.5 wt % or more. Additionally, the difference between the maximum value and the minimum value of the fluorine content distribution is preferably 1.0 wt % or less. If the fluorine content is smaller than 0.5 wt %, sufficient light transmittance tends not to be obtained because, e.g., internal absorption per cm in thickness exceeds 5%/cm. When the difference between the maximum value and the minimum value of the fluorine content distribution exceeds 1.0 wt %, the variation in transmittance tends to be large. To obtain silica glass which satisfies the preferable range of fluorine content distribution, isotactic pressing is preferably performed at a process temperature of 1,700° C. to 1,800° C. at a process time of 30 min to 2 hrs. If the process temperature is lower than 1,700° C., deformation processing tends to be insufficient when the process time is short, and glass tends to be devitrified when the process time is long. If the process temperature exceeds 1,800° C., bubbles tend to form in the glass, or contained fluorine tends to be externally diffused from the glass to increase the distribution. If the process time is shorter than 30 min, deformation of silica glass tends to be insufficient, and the fluorine content distribution tends to be insufficiently uniformed. If the process time exceeds 2 hrs, diffusion of fluorine in the silica glass is prompted, and consequently, a decrease in fluorine content or variation in distribution tends to occur.

In the first and second manufacturing methods, as a silicon compound used as a material, an organic silicon compound such as a siloxane such as hexamethyldisiloxane (HMDS), octamethylcyclotetrasiloxane (OMCTS), or tetramethylcyclotetrasiloxane (TMCTS), and a silane such as methyltrimethoxysilane, tetraethoxysilane, or tetramethoxysilane, a silicon chloride such as $SiCl_4$ or $SiHCl_3$, a silicon fluoride such as $SiF_4$ or $Si_2F_6$, or other silicon compound such as $SiH_4$ or $Si_2H_6$ can be used. Of these silicon compounds, the organic silicon compound and silicon fluoride are preferably used because the chlorine mixing amount into the silica glass is reduced, and silica glass with excellent UV resistance tends to be obtained.

The silica glass obtained by the above method is subjected to heat treatment or annealing as needed. The resultant silica glass is molded or cut into a desired shape and processed by predetermined polishing or coating, thereby obtaining an optical member such as a lens, photomask substrate, diffraction optical element (DOE), or etalon plate for a light source.

The optical member of the present invention, which is formed from the silica glass obtained by the above method, has high light transmittance and satisfactory UV resistance over the member. When a reduction projection exposure apparatus using this member as a lens of the optical system or a photomask substrate is used, high resolution can be attained in the pattern transfer process without generating line-width unevenness. To further improve the resolution of the apparatus, the internal absorption amount per cm in thickness of the member for light having a specific wavelength of 250 nm or less is preferably 5.0%/cm or less and, more particularly, 3.0%/cm or less. If the internal absorption amount per cm in thickness exceeds 5.0%/cm, light transmittance tends to be low, and heat generation due to light absorption and thermal expansion due to the heat tend to occur. As a detailed method of measuring the internal absorption amount, the vacuum UV spectrophotometer shown in FIG. 1 can be used.

In the present invention, the internal scattering amount per cm in thickness of the member for light having a specific wavelength of 250 nm or less is preferably 1.0%/cm or less. If an optical member whose internal scattering amount per cm in thickness exceeds 1.0%/cm is used, flare or ghost tends to occur in the pattern transfer process, resulting in low resolution. As a detailed method of measuring the internal scattering amount, a method of using a scattering measurement device having an integrating sphere or a method of measuring the amount of light scattering in a direction of 90° with respect to incident light can be used.

In the present invention, the maximum diameter of an internal defect (inclusion, micro inhomogeneity, or bubble) of the member is preferably 0.5 µm or less. When an optical member having an internal defect with a maximum diameter exceeding 0.5 µm is used, the image of the internal defect tends to be transferred in the pattern transfer process. As a detailed method of measuring internal absorption, a method of using an optical microscope can be used.

In the present invention, the concentrations of metal impurities such as sodium, aluminum, potassium, and calcium are preferably low. More specifically, the concentration of a metal impurity is preferably 50 ppb or less. If the concentration of a metal impurity exceeds 50 ppb, the variation in transmittance of the optical member for light tends to increase. Of the above metal impurities, sodium preferably has a concentration of 10 ppb or less, and aluminum preferably has a concentration of 20 ppb or less. If the concentration of sodium exceeds 10 ppb, the light transmittance of the optical member tends to largely lower. If the concentration of aluminum exceeds 20 ppb, internal defects tend to readily form in the heat treatment process. Due to the above reasons, it is important to eliminate the metal impurities in the synthesis and heat treatment processes of the silica glass.

A reduction projection exposure apparatus using the optical member of the present invention will be described next.

Figure 6:
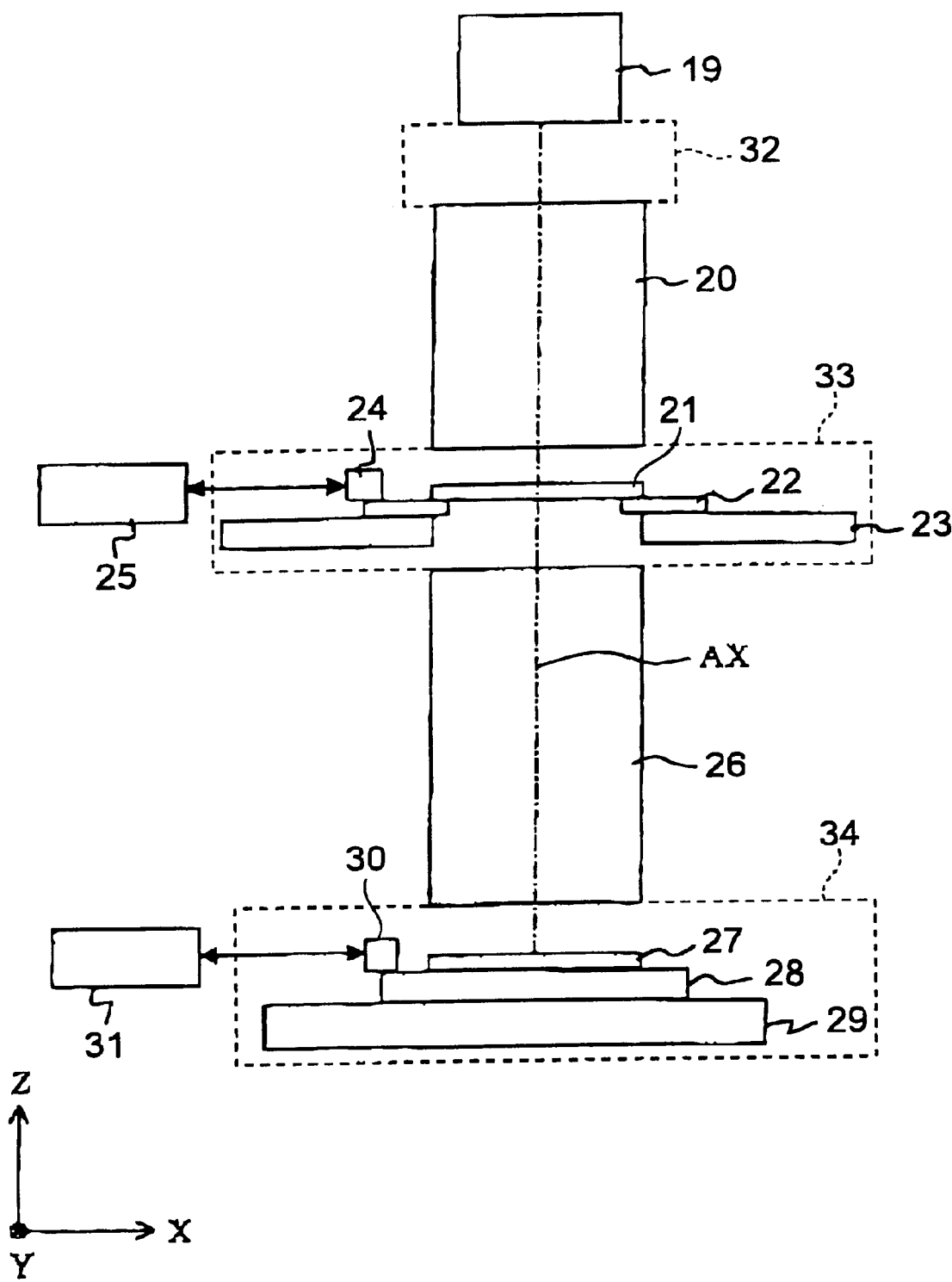
FIG. 6 is a schematic view showing the overall arrangement of a projection exposure apparatus having a projection optical system according to the present invention.

FIG. 6 is a schematic view showing the overall arrangement of a projection exposure apparatus having a reflection/refraction optical system. Referring to FIG. 6, the Z-axis is set parallel to the optical axis AX of a projection optical system 26, the X-axis is set parallel to the page surface of FIG. 6 within a plane perpendicular to the optical axis AX, and the Y-axis is set perpendicular to the page surface.

The projection exposure apparatus shown in FIG. 6 has a light source 19 for supplying illumination light having a wavelength of 250 or less. A photomask 21 having a predetermined pattern is uniformly illuminated with light emitted from the light source 19 through an illumination optical system 20. As the light source 19, a KrF excimer laser (248 nm), ArF excimer laser (193 nm), or $F_2$ laser (157 nm) can be used.

One or a plurality of deflecting mirrors for polarizing the optical path are arranged in the optical path from the light source 19 to the illumination optical system 20. The illumination optical system 20 has optical systems such as an optical integrator formed from a fly-eye lens or internal reflection-type integrator to form a surface light source having a predetermined size/shape, a field aperture for defining the size/shape of an illumination region on the photomask 21, and a field aperture imaging optical system for projecting the image of the field aperture onto the mask.

The optical path between the light source 19 and the illumination optical system 20 is sealed by a casing 32. The space from the light source 19 to an optical member in the illumination optical system 20 closest to the mask is substituted by an inert gas having a low exposure light absorbance.

The photomask 21 is held on a mask stage 23 through a mask holder 22 in parallel to the X-Y plane. A pattern to be transferred is formed on the photomask 21. Of the entire pattern region, a rectangular (slit-like) pattern region having its long side along the Y direction and short side along the X direction is illuminated.

The mask stage 23 can two-dimensionally move along the mask surface (X-Y plane), and the position coordinates of the mask stage 23 are measured and controlled by an interferometer 25 using a mask movable mirror 24.

Light from the pattern formed on the photomask 21 forms a mask pattern image on a wafer 27 serving as a photosensitive substrate through the projection optical system 26. The wafer 27 is held on a wafer stage 29 through a wafer holder 28 in parallel to the X-Y plane. On the wafer 27, the pattern image is formed in a rectangular exposure region having its long side along the Y direction and short side along the X direction.

The wafer stage 29 can two-dimensionally move along the wafer surface (X-Y plane), and the position coordinates of the wafer stage 29 are measured and controlled by an interferometer 31 using a wafer movable mirror 30.

In the projection exposure apparatus shown in FIG. 6, the interior of the projection optical system 26 is kept in the hermetic state, and the gas in the projection optical system 26 is substituted by an inert gas.

In the narrow optical path between the illumination optical system 20 and the projection optical system 26, the photomask 21, mask stage 23, and the like are arranged. A casing 33 which hermetically encloses the photomask 21, mask stage 23, and the like is filled with an inert gas.

In the narrow optical path between the wafer 27 and the projection optical system 26, the wafer 27, wafer stage 29, and the like are arranged. A casing 34 which hermetically encloses the wafer 27, wafer stage 29, and the like is filled with an inert gas such as nitrogen or helium gas.

Thus, an atmosphere where exposure light is rarely absorbed is formed along the entire optical path from the light source 19 to the wafer 27.

As described above, the field region (illumination region) on the photomask 21 and projection region (exposure region) on the wafer 27, which are defined by the projection optical system 26, have rectangular shapes having their short sides along the X direction. When the mask stage 23 and wafer stage 29, and additionally, the photomask 21 and wafer 27 are synchronously moved (scanned) along the short-side direction of the rectangular exposure region and illumination region, i.e., X direction while controlling the positions of the photomask 21 and wafer 27 using driving systems and interferometers (25 and 31), the mask pattern is scanned and exposed in a region on the wafer 27, which has a width equal to the long side of the exposure region and a length corresponding to the scanning amount (moving amount) of the wafer 27.

In the apparatus shown in FIG. 4, silica glass or single-crystal calcium fluoride is used as a material of the lens members of the illumination optical system 20 and projection optical system 26 and the photomask 21. A lens formed from single-crystal calcium fluoride is used in the projection optical system 26 to correct chromatic aberration. The shape of the photomask 21 is not particularly limited. Generally, a photomask having a vertical size of 60 to 200 mm, horizontal size of 60 to 200 mm, thickness of 1 to 1 mm, or a diameter of 100 to 300 mm and thickness of 1 to 7 mm is used. At least some of the silica glass lenses of the illumination optical system and projection optical system and the photomask are preferably formed from the optical member of the present invention. More preferably, all silica glass lenses of the illumination optical system and projection optical system are formed from the optical member of the present invention. In addition, the photomask is preferably formed from the optical member of the present invention.

Figure 7:
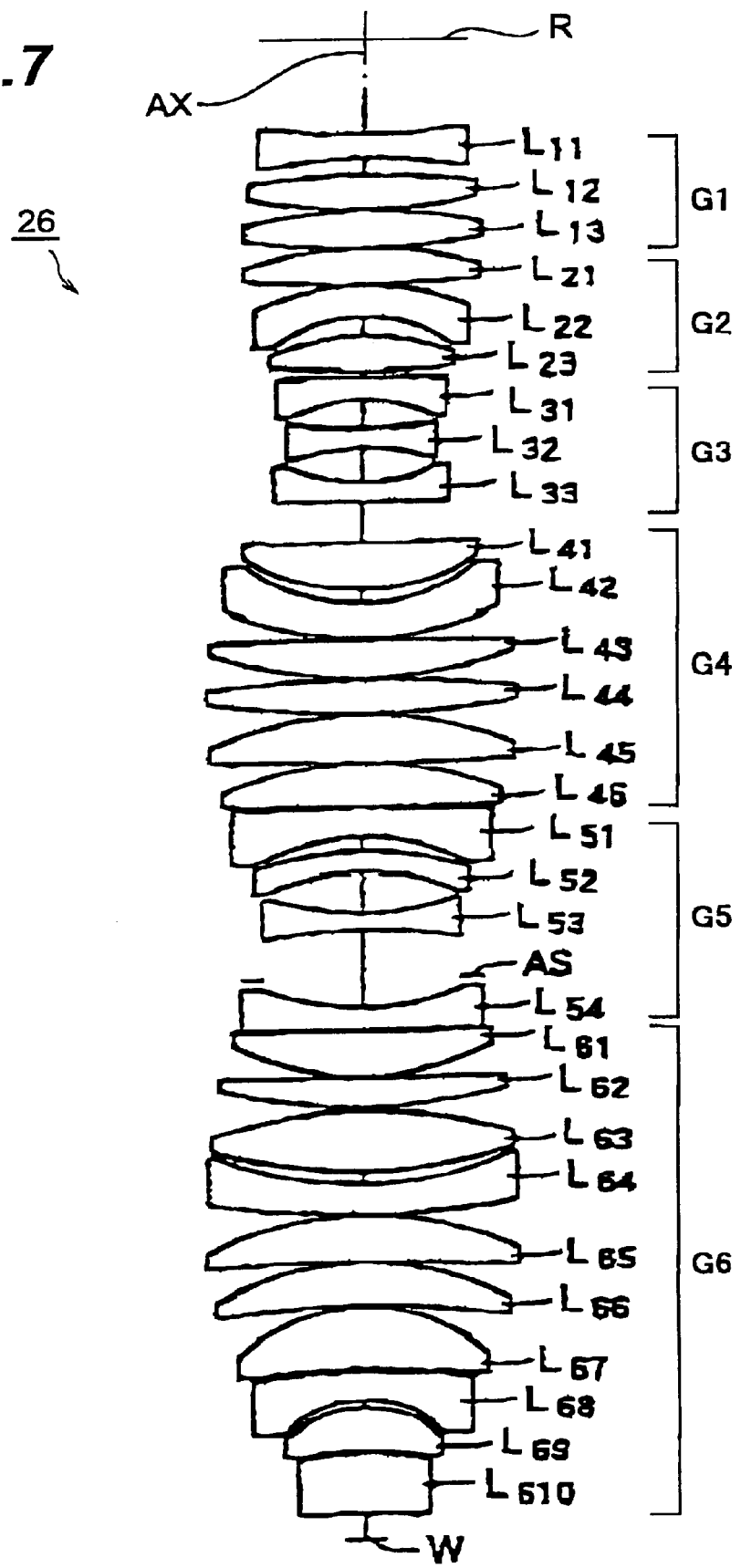
FIG. 7 is a schematic view showing the lens configuration of the projection optical system of the projection exposure apparatus shown in FIG. 6.

FIG. 7 is a schematic view showing the lens configuration of the projection optical system 26 shown in FIG. 6.

The projection optical system 26 shown in FIG. 7 has, sequentially from a reticle R as the first object, a first lens group G1 having positive power, a second lens group G2 having positive power, a third lens group G3 having negative power, a fourth lens group G4 having positive power, a fifth lens group G5 having negative power, and a sixth lens group G6 having positive power. The projection optical system is almost telecentric on the object side (reticle R side) and on the image side (wafer W side) and has a reduction magnification. the N.A. Of this projection optical system is 0.6, and the projection magnification is ¼.

In this projection optical system, of the lenses constituting the lens groups G1 to G6, six lenses L45, L46, L63, L65, L66, and L67 are formed from single-crystal calcium fluoride for the purpose of correcting chromatic aberration, and the remaining lenses are formed from silica glass. Of the lenses constituting the lens groups G1 to G6, at least one of lenses except the lenses L45, L46, L63, L65, L66, and L67 preferably uses the optical member of the present invention. More preferably, all lenses except the lenses L45, L46, L63, L65, L66, and L67 preferably use the optical member of the present invention.

When a lens whose difference between the maximum value and the minimum value of transmittance [%/cm] per cm in thickness for light having a wavelength of 250 nm or less is 2.0%/cm or less is used, the transmittance of the entire optical system is maintained at high level. When all silica glass lenses constituting the projection optical system are formed from the optical member of the present invention, the transmittance of the entire optical system further improves. When the optical member of the present invention is used as a photomask substrate, high light transmittance is achieved, and local thermal expansion of the substrate is suppressed. Hence, by using the reduction projection exposure apparatus having such an optical member, high resolution can be attained without generating line-width unevenness (print unevenness) in the pattern transfer process.

EXAMPLES

The present invention will be described below in more detail on the basis of examples. However, the present invention is not limited to the following examples.

Example 1

Silica glass was manufactured by the direct method using the apparatus shown in FIG. 4, which had the burner with the multi-tubular structure shown in FIG. 5. First, silicon tetrachloride diluted by a carrier gas was injected from the tube arranged at the central portion of the burner, and simultaneously, oxygen, hydrogen, hydrogen, oxygen, hydrogen, and oxygen were injected from the peripheral tubes, respectively, sequentially from the inner side to synthesize fine silica glass particles. Injection conditions of oxygen gas and hydrogen gas are shown in Table 1. In Table 1, the hydrogen gases injected from the tubes are represented by first hydrogen gas, second hydrogen gas, and third hydrogen gas sequentially from the inner side of the burner. Similarly, oxygen gases injected from the tubes are represented by first oxygen gas, second oxygen gas, and third oxygen gas sequentially from the inner side of the burner (this also applies to examples to be described below). The fine silica glass particles were deposited on a target 405 oscillating under conditions that the oscillation width was 80 mm, and the oscillation speed was 20 mm/sec or less, and simultaneously melted and vitrified to obtain an ingot of transparent silica glass.

TABLE 1

|  | Material | Flow Rate of Material [g/min] | First Hydrogen | | First Oxygen | | Second Hydrogen | |
|---|---|---|---|---|---|---|---|---|
|  |  |  | Flow Rate (slm) | Flow Speed (m/sec) | Flow Rate (slm) | Flow Speed (m/sec) | Flow Rate (slm) | Flow Speed (m/sec) |
| Example 1 | SiCl$_4$ | 30 | 75 | 53 | 22 | 23 | 130 | 6 |
| Example 6 | SiF$_4$ | 25 | 75 | 53 | 22 | 23 | 150 | 6 |
| Example 7 | HMDS | 15 | 50 | 52 | 43 | 30 | 120 | 5 |
| Example 8 | OMCTS | 10 | 50 | 52 | 43 | 30 | 140 | 6 |

|  | Second Oxygen | | Third Hydrogen | | Third Oxygen | |
|---|---|---|---|---|---|---|
|  | Flow Rate (slm) | Flow Speed (m/sec) | Flow Rate (slm) | Flow Speed (m/sec) | Flow Rate (slm) | Flow Speed (m/sec) |
| Example 1 | 44 | 13 | 300 | 3 | 132 | 5 |
| Example 6 | 44 | 13 | 300 | 3 | 132 | 5 |
| Example 7 | 72 | 20 | 300 | 3 | 132 | 5 |
| Example 8 | 72 | 20 | 300 | 3 | 132 | 5 |

A member having a desired thickness was cut from the 260-mm diameter ingot obtained by the above method, thereby obtaining a measurement sample for optical characteristics. This sample was used for measurement without any secondary process such as heat treatment or annealing.

For this sample, the difference between the maximum value and the minimum value of transmittance [%/cm] per cm in thickness in a predetermined direction within a plane perpendicular to the optical axis, the internal absorption amount and internal scattering amount per cm in thickness, the maximum diameter of internal defects, the concentrations of metal impurities (Na, Al, K, Mg, Ca, Ti, Cr, Mn, Fe, Co, and Ni), the hydroxyl group concentration and its distribution, and the fluorine concentration and its distribution were measured. To measure the difference between the maximum value and the minimum value of transmittance and the internal absorption amount, the vacuum UV spectrophotometer shown in FIG. 1 was used. To measure the internal scattering amount, a scattering measurement device having an integrating sphere was used. To measure the maximum diameter of internal defects, an optical microscope was used. To measure the concentrations of metal impurities, ICP-AES, ICP-MS, and radioactivation analyzer were used. The hydroxyl group concentration and its distribution were calculated on the basis of absorption peaks at 1,380 nm and 2,730 nm by measurement using the IR absorption process. The measurement wavelength used to measure the difference between the maximum value and the minimum value of transmittance, internal absorption amount, and internal scattering amount was 193 nm (for Examples 2 to 13 as well, these measurements were done using measurement wavelengths shown in Table 2). The distribution of hydroxyl group concentration was calculated by (distribution of hydroxyl group concentration [%]={$(C_{max}-C_{min})/C_{max}$}×100

(where $C_{max}$ and $C_{min}$ are the maximum value and minimum value of hydroxyl group concentration in a predetermined direction of the member, respectively).

Figure 8A:
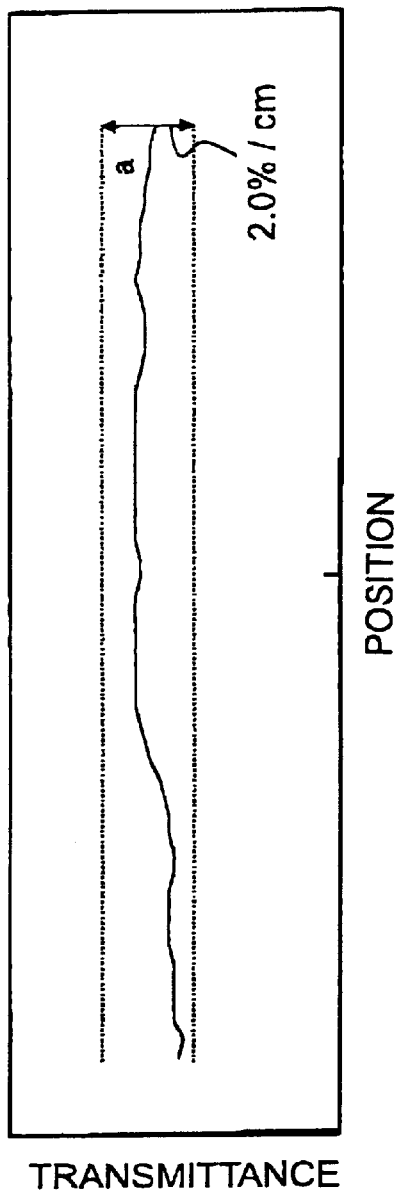
FIGS. 8A and 8B, respectively, are graphs showing the correlation between the sample position and the transmittance, which are obtained by transmittance measurement of Examples 1 and 2.

Table 2 shows the measurement results of optical characteristics of this sample. FIG. 8A is a graph showing the correlation between the sample position and the transmittance, which was obtained by measuring transmittance [%/cm] per cm in thickness of the sample. In Example 1, it was confirmed that the difference between the maximum value and the minimum value of transmittance was 2.0%/cm or less. In this sample, the internal absorption amount was 5.0%/cm or less, the internal scattering amount was 1.0%/cm or less, and the maximum diameter of internal defects was 0.5 μm or less. The hydroxyl group concentration in this sample satisfied the condition ranging from 800 ppm to 1,200 ppm, and its distribution was 20% or less. Although not shown in Table 2, the concentration of each metal impurity in this sample was 10 ppb or less, and total metal concentration was 50 ppb or less.

TABLE 2

| | Measurement Wavelength [nm] | Difference Between Maximum Value of Transmittance [%/cm] | Hydroxyl Group Concentration [ppm] | Distribution of Hydroxyl Group Concentration [%] | Fluorine Concentration [wt %] | Difference Between Maximum Value and Minimum Value of Fluorine Concentration [wt %] |
|---|---|---|---|---|---|---|
| Example 1 | 193 | 0.06 | 900 | 100 | — | — |
| Example 2 | 157.6 | 0.60 | ≦0.01 | — | 2.5 | 0.4 |
| Example 3 | 157.6 | 1.0 | 0.1 | 0.05 | 2.5 | 0.4 |
| Example 4 | 157.6 | 1.8 | 0.1 | 0.05 | 2.5 | 0.9 |
| Example 5 | 157.6 | 2.0 | 1.2 | 0.2 | 2.5 | 0.5 |
| Example 6 | 193 | 0.04 | 800 | 50 | 0.05 | 0.01 |

TABLE 2-continued

| | | | | | | |
|---|---|---|---|---|---|---|
| Example 7 | 193 | 0.08 | 1200 | 100 | — | — |
| Example 8 | 193 | 0.10 | 1000 | 150 | — | — |
| Example 9 | 157.6 | 0.60 | 0.1 | 0.02 | 2.4 | 0.4 |
| Example 10 | 157.6 | 0.80 | 0.1 | 0.02 | 2.7 | 0.4 |
| Example 11 | 157.6 | 1.0 | 0.1 | 0.02 | 2.2 | 0.4 |
| Example 12 | 157.6 | 1.0 | 0.1 | 0.02 | 2.3 | 0.4 |
| Example 13 | 157.6 | 0.5 | 0.2 | 0.04 | 0.1 | 0.05 |

| | Internal Absorption Amount [%/cm] | Internal Scattering Amount [%/cm] | Maximum Diameter of Internal Defects [μ/m] | Application Purpose (Light Source) |
|---|---|---|---|---|
| Example 1 | 1.0 | 0.6 | ≦0.5 | Lens (ArF Excimer Laser) |
| Example 2 | 1.0 | 0.6 | ≦0.5 | Photomask ($F_2$ Laser) |
| Example 3 | 3.0 | 0.8 | ≦0.5 | Photomask ($F_2$ Laser) |
| Example 4 | 3.0 | 0.8 | ≦0.5 | Photomask ($F_2$ Laser) |
| Example 5 | 5.0 | 1.0 | ≦0.5 | Photomask ($F_2$ Laser) |
| Example 6 | 0.5 | 0.65 | ≦0.5 | Lens (ArF Excimer Laser) |
| Example 7 | 1.0 | 0.7 | ≦0.5 | Lens (ArF Excimer Laser) |
| Example 8 | 2.0 | 0.7 | ≦0.5 | Lens (ArF Excimer Laser) |
| Example 9 | 2.0 | 0.9 | ≦0.5 | Photomask ($F_2$ Laser) |
| Example 10 | 1.0 | 1.0 | ≦0.5 | Photomask ($F_2$ Laser) |
| Example 11 | 3.0 | 1.0 | ≦0.5 | Photomask ($F_2$ Laser) |
| Example 12 | 3.0 | 1.1 | ≦0.5 | Photomask ($F_2$ Laser) |
| Example 13 | 4.0 | 0.8 | ≦0.5 | Photomask ($F_2$ Laser) |

Next, this silica glass was fabricated into a desired lens shape (φ:30 to 300 mm×t:1 to 100 mm) to manufacture an optical system shown in FIG. 7. Referring to FIG. 7, lenses made of single-crystal calcium fluoride were used as lenses L45, L46, L63, L65, L66, and L67, and all lenses except these lenses were formed from the optical member of Example 1. A reduction projection exposure apparatus (stepper) shown in FIG. 6, which has such an optical system, was manufactured, and the imaging performance of the apparatus using an ArF excimer laser as a light source was evaluated. It was confirmed that no line-width unevenness was observed at a line-and-space of 0.15 μm or less, and satisfactory imaging performance was obtained.

Example 2

In Example 2, optical member was manufactured according to the following procedures.

First, using a quintuple-tubular burner, silicon tetrachloride diluted by a carrier gas was injected from the tube arranged at the central portion of the burner, and simultaneously, oxygen, hydrogen, oxygen, and hydrogen were injected from the peripheral tubes sequentially from the inner side to obtain a silica glass soot body having a diameter of 150 mm and length of 500 mm. The resultant soot body was supplied into a heating furnace and annealed at 1,050° C. in a mixed gas atmosphere of chlorine and helium and then annealed at 1,250° C. in a mixed gas atmosphere of silicon tetrafluoride and helium. This soot body was heated to 1,600° C. and consolidated, thereby obtaining silica glass having a diameter of 70 mm and length of 260 mm. The two ends of this silica glass were cut off to form silica glass having a diameter of 70 mm and length of 200 mm. This silica glass was subjected to isotactic pressing at 1,775° C. for 1 hr to increase the diameter 230 mm. The resultant silica glass was cut and polished, thereby obtaining a photomask substrate having a size of □:120 to 180 mm×t:¼ inch (6.35 mm).

Figure 8B:
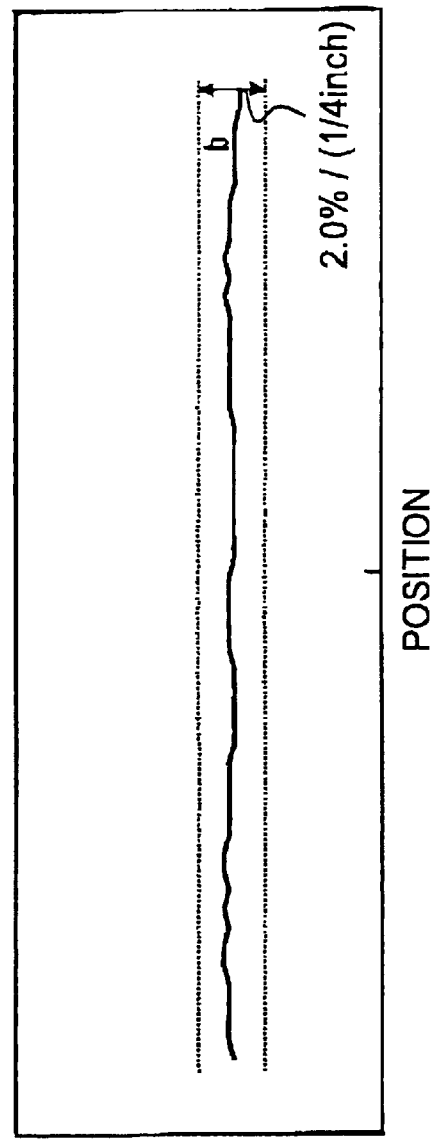

For this member, using the same method as in Example 1 the difference between the maximum value and the minimum value of transmittance [%/(¼ inch)] per ¼ inch in thickness in a predetermined direction within a plane perpendicular to the optical axis, the internal absorption amount and internal scattering amount per cm in thickness, the maximum diameter of internal defects, the concentrations of metal impurities (Na, Al, K, Mg, Ca, Ti, Cr, Mn, Fe, Co, and Ni), and the hydroxyl group concentration and its distribution were measured. In addition, the fluorine concentration and its distribution were measured by Raman spectroscopy. The results are shown in Table 2. FIG. 8B is a graph showing the correlation between the sample position and the transmittance, which was obtained by measuring transmittance in Example 2. In the sample of Example 2, it was confirmed that the difference between the maximum value and the minimum value of transmittance per ¼ inch in thickness was 2.0%/(¼ inch) or less. In this sample, the internal absorption amount was 5.0%/cm or less, the internal scattering amount was 1.0%/cm or less, and the maximum diameter of internal defects was 0.5 μm or less. The hydroxyl group concentration in this sample was 20 ppm or less, and its distribution was 20% or less. The fluorine concentration in this sample was 2.5 wt %, and for its distribution, the difference between the maximum value and the minimum value is 0.4 wt %. Although not shown in Table 2, the concentration of each metal impurity in the sample was 10 ppb or less, and total metal concentration was 50 ppb or less.

Next, using this photomask substrate, a reduction projection exposure apparatus (stepper) shown in FIG. 6, which uses an $F_2$ laser as a light source, was manufactured, and its imaging performance was confirmed. It was confirmed that no line-width unevenness was observed at a line-and-space of 0.09 μm, and satisfactory imaging performance was obtained.

Examples 3–5 and 9–13

In Examples 3 to 5 and 9 to 13, silica glass samples were synthesized using the same method as in Example 2 except that, as a material, silicon tetrachloride ($SiCl_4$) was used in Examples 3 to 5 and 13, silicon tetrafluoride ($SiF_4$) was used in Examples 9 and 10, hexamethyldisiloxane (HMDS) was used in Example 11, and octamethylcyclotetrasiloxane (OMCTS) was used in Example 12. In Examples 3 to 5, 9, 10, and 13, oxygen, hydrogen, oxygen, and hydrogen were injected from tubes arranged around the tube at the central portion of a burner sequentially from the inside. In Examples 11 and 12, hydrogen, oxygen, oxygen, and hydrogen were injected sequentially from the inside. In Example 9, no fluorine atmosphere process was executed.

For each of resultant photomask substrates of Examples 3 to 5 and 9 to 13, using the same method as in Example 2, the difference between the maximum value and the minimum value of transmittance, the internal absorption amount, the internal scattering amount, the maximum diameter of internal defects, the concentrations of metal impurities, the hydroxyl group concentration and its distribution, and the fluorine concentration and its distribution were measured. The results are shown in Table 2. In any sample of Examples 3 to 5 and 9 to 13, it was confirmed that the variation width of transmittance per ¼ inch in thickness was 2.0%/(¼ inch) or less. In any sample, the internal absorption amount was 5.0% or less, and the maximum diameter of internal defects was 0.5 µm or less. In any sample, the hydroxyl group concentration was 20 ppm or less, and its distribution was 20% or less. Although not shown in Table 2, the concentration of each metal impurity in each of the samples of Example 3 to 5 and 9 to 13 was 10 ppb or less, and no sample has a total metal concentration more than 50 ppb. In all of Examples 3 to 5 and 9 to 13, the internal scattering amount was 1.0% or less. It was also confirmed that in the samples of Examples 3 to 5 and 10 to 13, which had undergone the fluorine atmosphere process, fluorine was uniformly doped in the entire silica glass, while in Example 9 in which no fluorine atmosphere process was executed, the fluorine concentration is lower than in the remaining examples. The present inventors estimate that the fluorine concentration was lower in Example 9 because fluorine near the surface was diffused in annealing of silica glass.

Next, as in Example 2, using each of the photomask substrates obtained in Examples 3 to 5 and 10 to 13, a reduction projection exposure apparatus (stepper) shown in FIG. 6, which uses an $F_1$ laser as a light source, was manufactured, and its imaging performance was confirmed. It was confirmed that no line-width unevenness was observed at a line-and-space of 0.09 µm, and satisfactory imaging performance was obtained.

Examples 6–8

In Examples 6 to 8, silica glass samples were manufactured using the same method as in Example 1 except that, in Example 6, oxygen, hydrogen, hydrogen, oxygen, hydrogen, and oxygen were injected from tubes arranged around the tube at the central portion of a burner sequentially from the inside, and in Examples 7 and 8, hydrogen, oxygen, hydrogen, oxygen, hydrogen, and oxygen were injected sequentially from the inside. Injection conditions of oxygen gas and hydrogen gas are shown in Table 1.

For each of samples obtained in the examples, using the same method as in Example 1, the transmittance, the internal absorption amount, the internal scattering amount, the maximum diameter of internal defects, the concentrations of metal impurities, and the hydroxyl group concentration and its distribution were measured. The measurement results are shown in Table 2. In any sample of Examples 6 to 8, it was confirmed that the difference between the maximum value and the minimum value of transmittance was 2.0%/cm or less. In any sample, the internal absorption amount was 5.0%/cm or less, the internal scattering amount was 1.0%/cm or less, and the maximum diameter of internal defects was 0.5 µm or less. In any sample, the hydroxyl group concentration was 800 ppm to 1,200 ppm, and its distribution was 20% or less. In Example 6, the fluorine concentration was 0.05 wt %, and for its distribution, the difference between the maximum value and the minimum value was 0.01 wt % or less. Although not shown in Table 2, the concentration of each metal impurity in each of the samples of Example 6 to 8 was 10 ppb or less, and no sample has a total metal concentration more than 50 ppb.

Next, as in Example 1, the optical system shown in FIG. 7, in which all lenses except lenses L45, L46, L63, L65, L66, and L67 were formed from the silica glass of each of Examples 6 to 8 was manufactured. A reduction projection exposure apparatus shown in FIG. 6, which has such an optical system, was manufactured, and the imaging performance of the stepper using an ArF excimer laser as a light source was evaluated. It was confirmed that in any apparatus, no line-width unevenness was observed at a line-and-space of 0.15 µm or less, and satisfactory imaging performance was obtained.

INDUSTRIAL APPLICABILITY

As has been described above, the optical member of the present invention has high light transmittance and UV resistance over the optical member. Hence, when this optical member is used for a reduction projection exposure apparatus using light having a wavelength of 250 nm or less, very high resolution can be achieved without generating line-width unevenness (print unevenness) in the pattern transfer process.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A synthetic silica glass optical member used together with light having a specific wavelength of not more than 250 nm, wherein a difference between a maximum value and a minimum value of transmittance per cm (%/cm) in thickness for the light in a predetermined direction within a plane perpendicular to an optical axis is not more than 2.0%/cm.

2. An optical member according to claim 1, wherein said synthetic silica glass optical member is used together with light having a specific wavelength of not more than 190 nm, and the difference between the maximum value and the minimum value of transmittance per ¼ inch (%/(¼ inch)) in thickness for the light in the predetermined direction within the plane perpendicular to the optical axis is not more than 2.0%/(¼ inch).

3. A synthetic silica glass optical member according to claim 1, wherein said synthetic silica glass optical member is used together with light having a specific wavelength of 190 nm to 250 nm, and a hydroxyl group concentration in said member is 500 ppm to 1,200 ppm.

4. A synthetic silica glass optical member according to claim 1, wherein said synthetic silica glass optical member is used together with light having a specific wavelength of not more than 190 nm, and a hydroxyl group concentration in said member is not more than 20 ppm.

5. A synthetic silica glass optical member according to claim 1, wherein an internal absorption amount per cm (%/cm) in thickness for the light having a specific wavelength of not more than 250 nm is not more than 5.0%/cm.

6. A synthetic silica glass optical member according to claim 1, wherein an internal scattering amount per cm (%/cm) in thickness for the light having a specific wavelength of not more than 250 nm is not more than 1.0%/cm.

7. A synthetic silica glass optical member according to claim 1, wherein a maximum diameter of an internal defect in said member is not more than 0.5 µm.

8. A synthetic silica glass optical member according to claim 1, wherein said member comprises a lens.

9. A synthetic silica glass optical member according to claim 1, wherein said member comprises a photomask.

10. A reduction projection exposure apparatus comprising: an exposure light source for emitting light having a wavelength of not more than 250 nm; a photomask having an original image of a pattern; an illumination optical system for irradiating said photomask with the light emitted from said light source; a projection optical system for projecting the pattern image output from said photomask onto a photosensitive substrate; and an alignment system for aligning said photomask and the photosensitive substrate, wherein at least a part of lenses of said illumination optical system, lenses of said projection optical system, and said photomask are formed from synthetic silica glass in which a difference between a maximum value and a minimum value of transmittance per cm (%/cm) in thickness for the light in a predetermined direction within a plane perpendicular to an optical axis is not more than 2.0%/cm.

11. A reduction projection exposure apparatus according to claim 10, wherein all of silica glass lenses of said illumination optical system and said projection optical system are formed from synthetic silica glass in which the difference between the maximum value and the minimum value of transmittance per cm (%/cm) in thickness for the light in the predetermined direction within the plane perpendicular to the optical axis is not more than 2.0%/cm.

12. A reduction projection exposure apparatus according to claim 10, wherein said photomask is formed from synthetic silica glass in which the difference between the maximum value and the minimum value of transmittance per cm (%/cm) in thickness for the light in the predetermined direction within the plane perpendicular to the optical axis is not more than 2.0%/cm.

* * * * *